United States Patent [19]

Yamazaki

[11] Patent Number: 5,474,948
[45] Date of Patent: Dec. 12, 1995

[54] METHOD OF MAKING SEMICONDUCTOR DEVICE HAVING POLYSILICON RESISTANCE ELEMENT

[75] Inventor: Yasushi Yamazaki, Tokyo, Japan

[73] Assignee: NEC Corporation, Japan

[21] Appl. No.: 994,095

[22] Filed: Dec. 18, 1992

Related U.S. Application Data

[63] Continuation of Ser. No. 779,965, Oct. 21, 1991, abandoned.

[30] Foreign Application Priority Data

Oct. 22, 1990 [JP] Japan ................... 2-283907

[51] Int. Cl.[6] ................................. H01L 21/70
[52] U.S. Cl. ................ 437/60; 437/47; 437/52; 437/193; 437/195; 437/918; 148/DIG. 136; 257/379; 257/380; 257/381; 257/903; 257/904
[58] Field of Search ................. 357/51; 437/60, 437/195, 191, 193, 47, 918, 52; 257/379, 380, 381, 904, 903; 148/DIG. 136

[56] References Cited

U.S. PATENT DOCUMENTS

| | | | |
|---|---|---|---|
| 3,573,570 | 4/1971 | Fuller et al. ................. | 357/71 |
| 4,408,385 | 11/1983 | Mohan Rao et al. ........ | 437/918 |
| 4,446,613 | 5/1984 | Beinglass et al. ........... | 29/571 |
| 4,841,481 | 6/1989 | Ikeda et al. .................. | 257/379 |
| 4,862,241 | 8/1989 | Ashida et al. ............... | 357/95 |
| 4,903,096 | 2/1990 | Masuoka et al. ............ | 257/380 |
| 4,984,200 | 1/1991 | Saitoo et al. ................ | 257/904 |
| 5,001,108 | 3/1991 | Taguchi ....................... | 505/1 |
| 5,135,882 | 8/1992 | Karniewicz .................. | 437/60 |
| 5,187,114 | 2/1993 | Chan et al. .................. | 437/60 |
| 5,196,233 | 3/1993 | Chan et al. .................. | 437/60 |
| 5,204,279 | 4/1993 | Chan et al. .................. | 437/918 |
| 5,252,504 | 10/1993 | Lowrey et al. .............. | 437/60 |
| 5,268,325 | 12/1993 | Spinner, III et al. ........ | 437/60 |

FOREIGN PATENT DOCUMENTS

| | | | |
|---|---|---|---|
| 0120150 | 9/1980 | Japan ............................ | 437/191 |
| 0089239 | 6/1982 | Japan ............................ | 437/191 |
| 0048939 | 3/1983 | Japan ............................ | 437/191 |

OTHER PUBLICATIONS

Reisman, "Selective Tungsten on Si . . . " *J. of Elechem Soc*, vol. 137, No. 2, Feb. 1990, pp. 722–727.

*Primary Examiner*—Olik Chaudhuri
*Assistant Examiner*—Long Pham
*Attorney, Agent, or Firm*—Laff, Whitesel, Conte & Saret, Ltd.

[57] ABSTRACT

A polysilicon resistor element and a semiconductor device using the same are disclosed. The polysilicon resistor element has a resistive polysilicon film formed on a predetermined interlayer insulating film of a semiconductor chip. The resistive polysilicon film is covered by an insulating film having holes and high melting point metal films are formed in self-alignment to the holes. The high melting metal film constitutes one of lead portions of the polysilicon resistor element. A diffusion of the high melting point metal film due to heat treatment during fabrication, which causes an effective length of the resistor element, becomes negligible and reproducibility is improved.

2 Claims, 6 Drawing Sheets

METHOD OF MAKING SEMICONDUCTOR DEVICE HAVING POLYSILICON RESISTANCE ELEMENT

This application is a continuation of application Ser. No. 07/779,965, filed Oct. 21, 1991, now abandoned.

BACKGROUND OF THE INVENTION

The present invention relates to a polysilicon resistor element and a semiconductor device using the same.

As SRAM is a typical example of a semiconductor device having a polysilicon resistor element. That is, a resistive load MOS SRAM includes a polysilicon resistor element as a load resistor for an inverter conforming a flip-flip of each memory cell. The polysilicon resistor element is connected between a drive transistor of the inverter and a voltage source wiring in a memory cell array (referred to as "in-cell voltage source wiring", hereinafter). The polysilicon resistor element and the in-cell voltage source wiring are formed from polysilicon films formed simultaneously. The polysilicon resistor element includes a resistor portion which is lightly doped with impurity and lead portions which are heavily doped, and the in-cell voltage source wiring is also heavily doped with impurity. That is, the lead portions of the polysilicon resistor element is electrically connected to the in-cell voltage source wiring.

A formation of such polysilicon resistor element and in-cell voltage source wiring will be described.

A semiconductor chip having drive transistors, etc., formed therein and covered with an interlayer insulating film is prepared and through-holes are formed in drain regions of the drive transistors. A non-doped polysilicon film having thickess in the order of 100 nm is deposited thereon by low pressure CVD. The whole surface of this wafer is ion-injected with phosphor at $1 \times 10^{14}$ cm$^{-2}$ resulting in a resistive polysilicon film lightly doped with N type impurity. The resistive polysilicon film thus formed is selectively covered with a silicon nitride film having thickness in the order of 100 nm and an area of the polysilicon film which is not covered with the silicon nitride film is non-injected with arsenic at about $1 \times 10^{16}$ cm$^{-2}$ and the wafer is heat treated for activation.

A conductive polysilicon film thus formed constitutes the lead portions of the polysilicon resistor element and the in-cell voltage source wiring.

Thereafter, formation of a second interlayer insulating film, deposition of a PSG (phospho-silicate glass) film, reflow processing and formation of an upper wiring are performed, resulting in a semiconductor device. In other words, since there are several heat treatments after the arsenic ion implantation, diffusion of impurity may occur by which the lead portions of the polysilicon resistor element is expanded and an effective length of the resistor portion (resistive polysilicon film) becomes shorter.

Such expansion of the conductive polysilicon film due to diffusion of impurity depends upon heating temperature, time and diffusion coefficient of impurity. The diffusion coefficient of arsenic in a polysilicon film is larger than in monocrystalline silicon and depends largely upon grain size of polysilicon film. The grain size of polysilicon film is hardly controlled. Thus, the effective length of the resistor portion varies with variation of fabricating conditions of the semiconductor device. The polysilicon resistor element is generally designed by taking such variation of effective length into consideration. In order to limit power consumption of the memory cell within a permissible range, it is usual to make the design size of the polysilicon resistor element larger. Therefore, this face makes a source of obstruction against the requirement of miniaturization of memory cell array. For these reasons, it is very difficult to use polysilicon resistor element in a SRAM having capacity of 4M bits or more unless such variation of effective length is minimized.

The in-cell voltage source wiring is connected to a metal wiring of aluminum or aluminum alloy at a constant interval, that is, for example, every 256 memory cells, and supplied with a source voltage through the metal wiring. In a connecting portion between the metal wiring and the in-cell voltage source wiring, there may be a reaction between aluminum and silicon, such as interdiffusion, by which ohmic contact is degraded. Such problems can be solved by providing a barrier metal therebetween, if complicated processes for provision of such barrier metal is allowed.

Although the problem of expansion of the lead portions and the problem of connecting portion between the metal wiring and the lead portions are described for the SRAM as example, they are common to semiconductor devices having polysilicon resistor elements.

BRIEF SUMMARY OF THE INVENTION

An object of the present invention is to provide a polysilicon resistor element capable of being formed with high reproducibility.

Another object of the present invention is to provide a semiconductor device having MOS SRAM cells and capable of being integrated at high density.

The polysilicon resistor element according to the present invention includes a resistive polysilicon film having a predetermined pattern and formed on a predetermined interlayer insulating film of a semiconductor chip. The resistive polysilicon film is covered with an insulating film having holes and a high melting point metal, that is, refractory metal, film of such as tungsten is provided in the holes, preferably, in self-aligned manner. The refractory metal film constitutes at least one of lead portions of the polysilicon resistor element. The reduction of effective length of the resistor portion due to impurity diffusion from the lead portions can be prevented, resulting in an improved reproducibility.

The semiconductor device having MOS SRAM cells, according to the present invention, includes the polysilicon resistor element as a load resistor of the resistive load MOS SRAM cell. Further, it includes in-cell voltage source wiring for interconnecting the lead portions of the load resistors of a plurality of SRAM cells in the form of refractory metal film. Since it includes highly reproducible load resistor, the size thereof can be designed smaller. Therefore, the reduction of SRAM cell area, i.e., high integration density, becomes attainable.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein:

FIG. 2b is a cross section taken along a line Y—Y in FIG. 2a;

FIG. 3b is a cross section taken along a line Y—Y in FIG. 3a;

FIG. 4b is a cross section taken along a line Y—Y in FIG. 4a;

FIG. 5b is a cross section taken along a line Y—Y in FIG. 5a;

FIG. 6b is a cross section taken along a line Y—Y in FIG. 6a.

DETAILED DESCRIPTION OF THE PREFERRED EMBODIMENTS

A resistive load MOS SRAM memory cell array will be described with reference to FIG. 1.

A memory cell Mi,s is arranged in a cross point of a work line Wi (i=1, 2, ..., M) and a pair of digit lines Ds, $\overline{Ds}$ (s=1, 2, ..., N). The memory cell Mi,s includes a first inverter composed of a first drive transistor T1 and a first load resistor R1 and a second inverter composed of a second drive transistor T2 and a second load resistor R2. Source regions of the first and second drive transistors T1 and T2 are connected to a grounding line GND. The first load resistor R1 is inserted between an in-cell voltage source wiring VS and a drain region of the first drive transistor T1. The second load resistor R2 is inserted between the in-cell voltage source wiring VS and a drain region of the second drive transistor T2. Gate electrodes of the first and second drive transistors T1 and T2 are connected to drain regions of the second and first drive transistors T2 and T1, respectively.

The drain regions of the first and second drive transistors T1 and T2 are connected to the digit lines Ds and $\overline{Ds}$ through a first transfer transistor T3 and a second transfer transistor T4, respectively. Gate electrodes of the first and second transfer resistors T3 and T4 are connected to the word line Wi,s. That is, the memory cell is a resistive load flip-flop.

Figure 1:
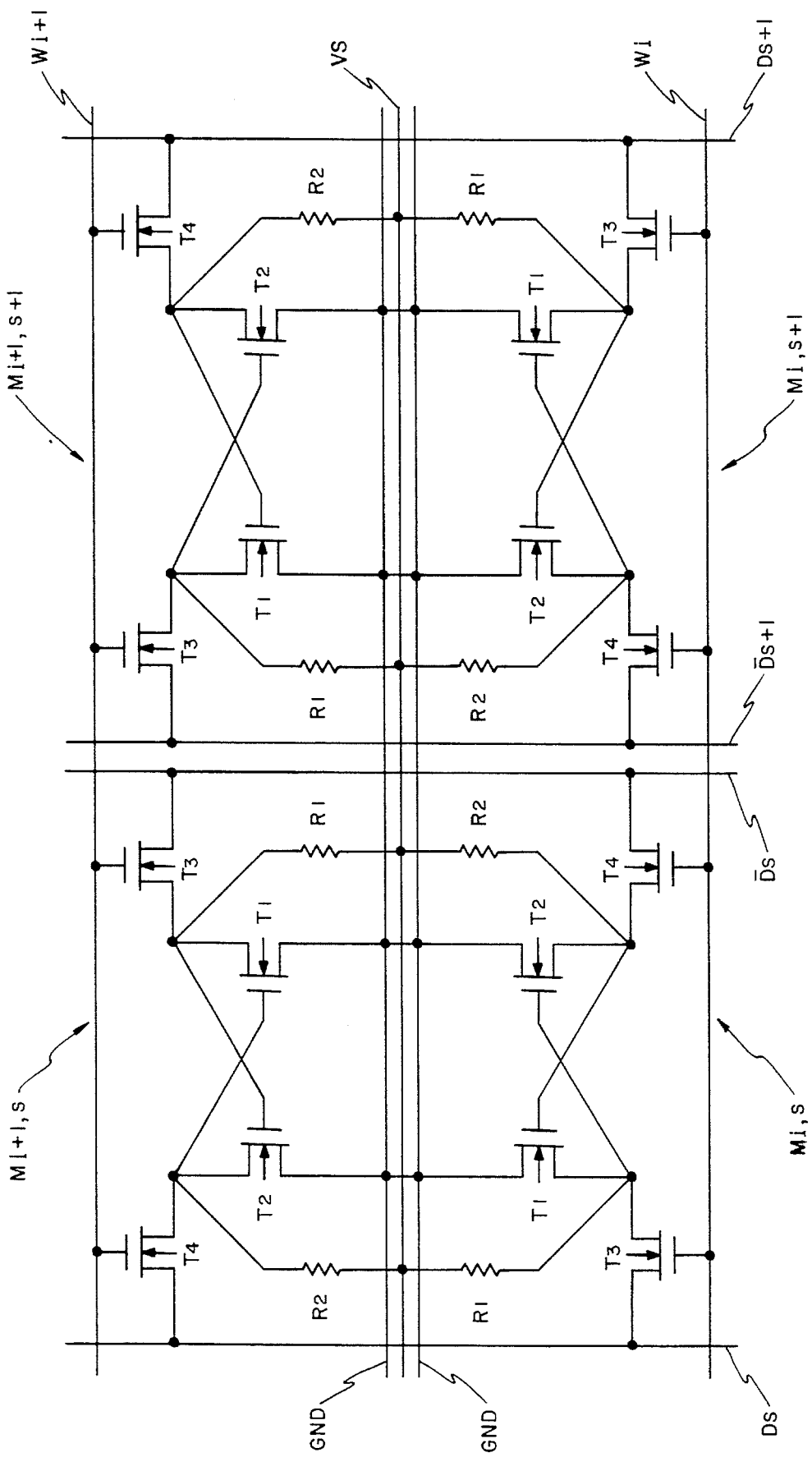
FIG. 1 is a circuit diagram of a portion of a memory cell array in a MOS SRAM.

In FIG. 1, elements having line symmetrical or point symmetrical shape are depicted by same reference numeral. Details thereof will be described later.

Figure 2A:
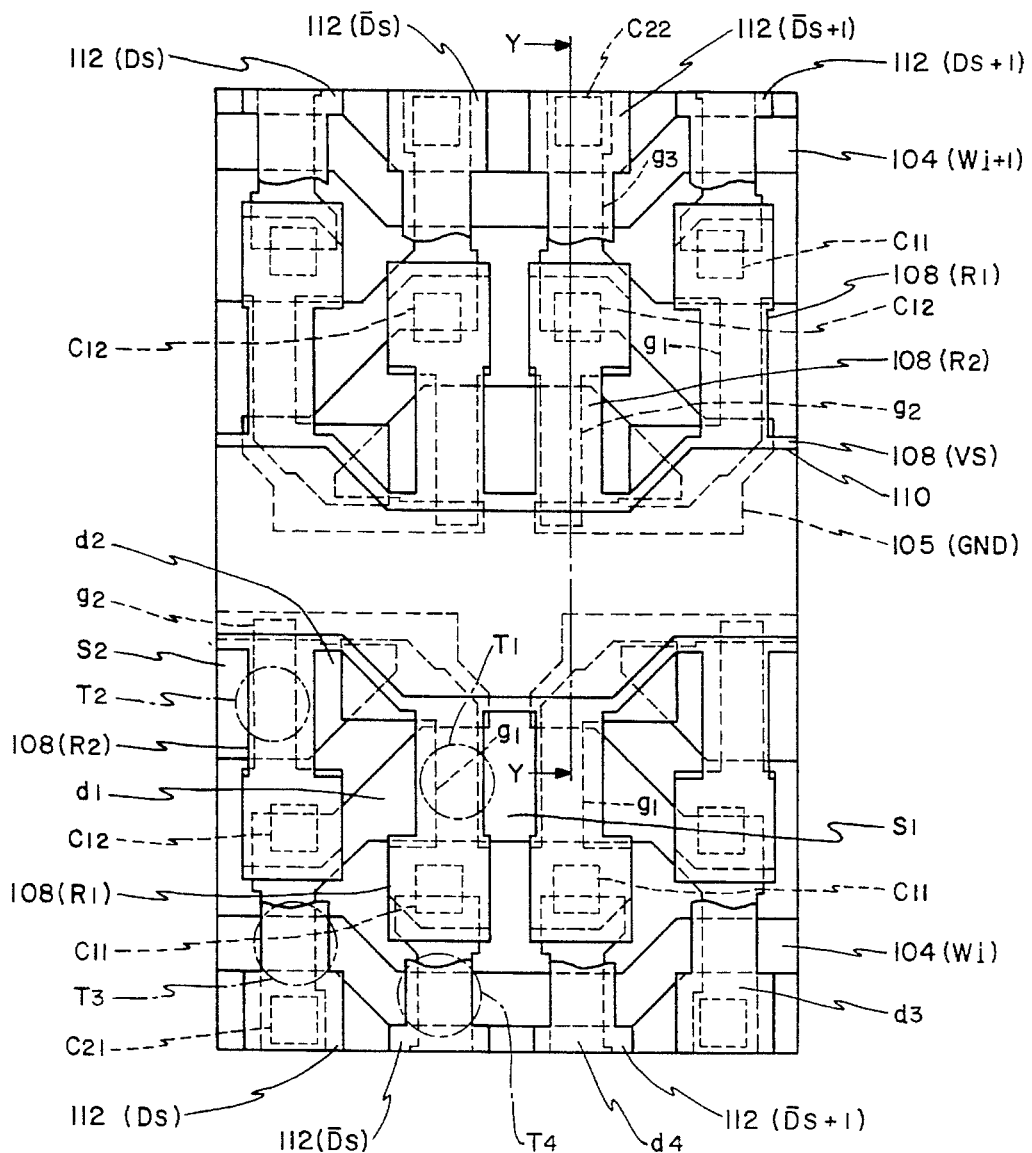
FIG. 2a is a plan view showing schematically a portion of a memory cell array of a MOS SRAM according to an embodiment of the present invention.

The memory cell array has a construction formed by arranging a plurality of blocks each including 4 memory cells each shown in FIG. 1 and FIG. 2a, in line and column matrix.

Figure 2B:
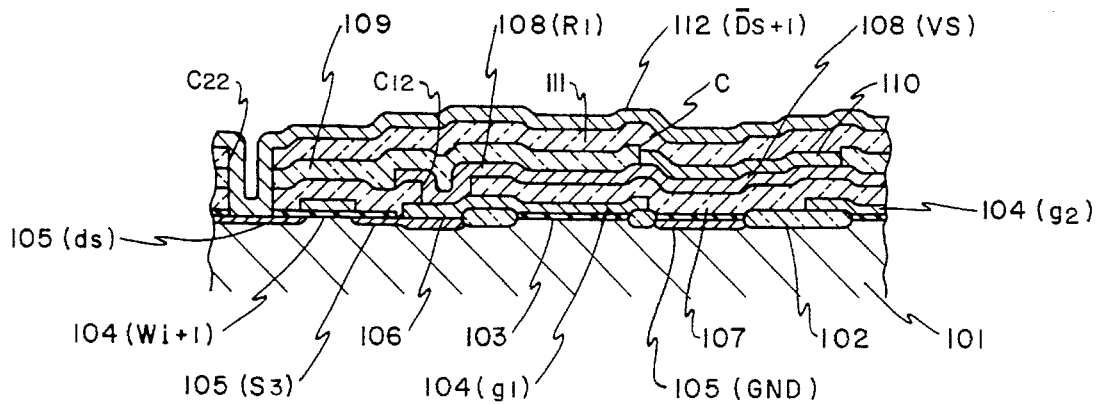

Referring to FIGS. 2a and 2b, an embodiment of the present invention includes polysilicon resistor elements R1 and R2.

A resistive polysilicon film 108 is formed on a first interlayer insulating film 107 of a semiconductor chip. The resistive polysilicon film 108 includes a main portion 108 (VS) extending in X direction in FIG. 2a and branch portions 108(R1) and 108(R2) extending from both sides of the main portion 108(VS) in Y direction. The resistive portion 108 is covered by a second interlayer insulating film 109. The second interlayer insulating film 109 is formed with holes C in positions along the main portion 108(VS). In each hole C, a tungsten film 110 is provided. An in-cell voltage source wiring VS is formed as a double layer structure including the tungsten film 110 and the main portion 108(VS) of the resistive polysilicon film. The branch portions 108(R1) and 108(R2) are in contact with a first layer polysilicon film 104 through a first contact hole C11 and a second contact hole C12. That is, one of lead portions of the polysilicon resistor element is the tungsten film 110 and the other is the first layer polysilicon film 104. The resistive polysilicon 108 is highly uniformly doped with impurity. Therefore, it is possible to prevent the reduction of effective length of the resistor portion due to impurity diffusion from the one lead portion thereof and to realize a polysilicon film resistor element with high reproducibility. Since it is unnecessary to set the length of the branch portion larger in view of the reduction of effective length of the resistor portion, high density integrated MOS SRAM is realized.

Now a fabrication method of this embodiment will be described.

Figure 3A:
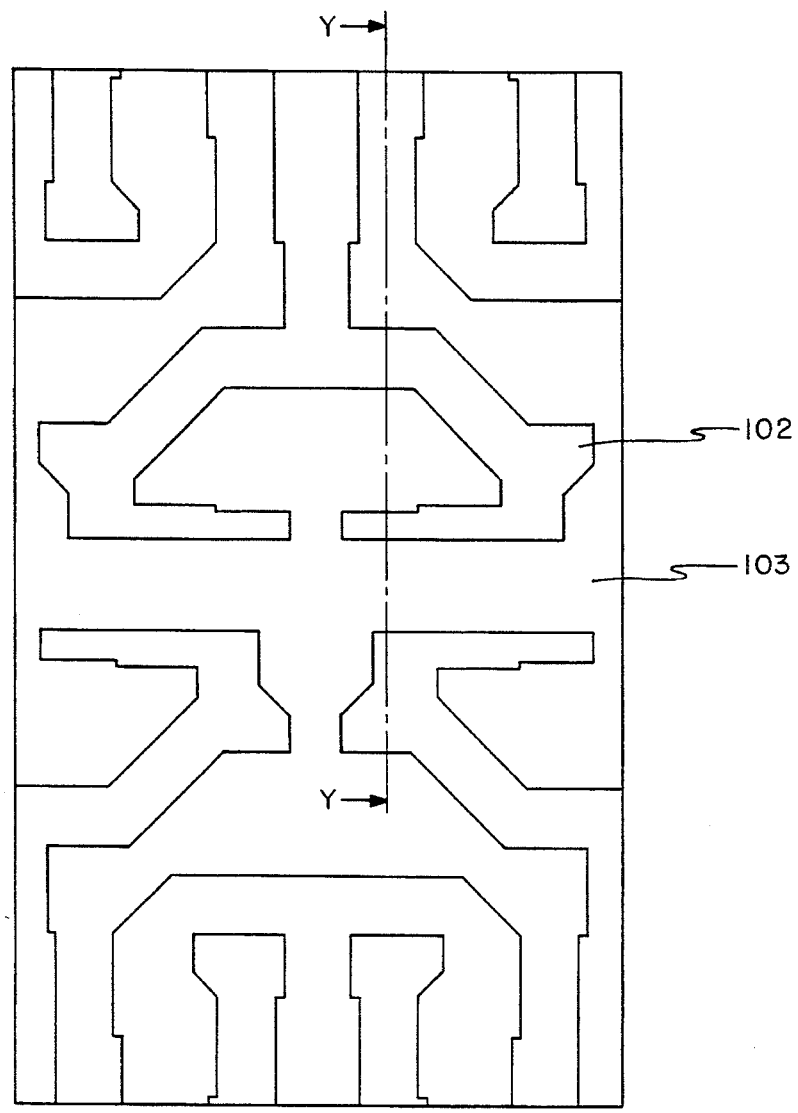
FIG. 3a is a plan view showing schematically an element forming region of a portion of the memory cell array of the MOS SRAM according to the embodiment of the present invention.
Figure 3B:
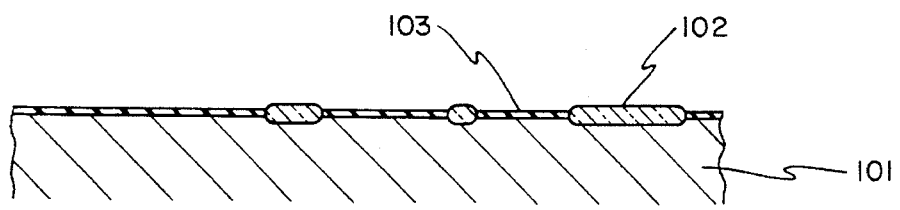

As shown in FIGS. 3a and 3b, a P type silicon substrate 101 is selectively oxidized to form a field insulating film 102, by which a plurality of discrete element forming regions 1 are provided. Then, a silicon oxide film about 20 nm thick is formed on a surface of the element forming region as a gate insulating film 103.

Figure 4A:
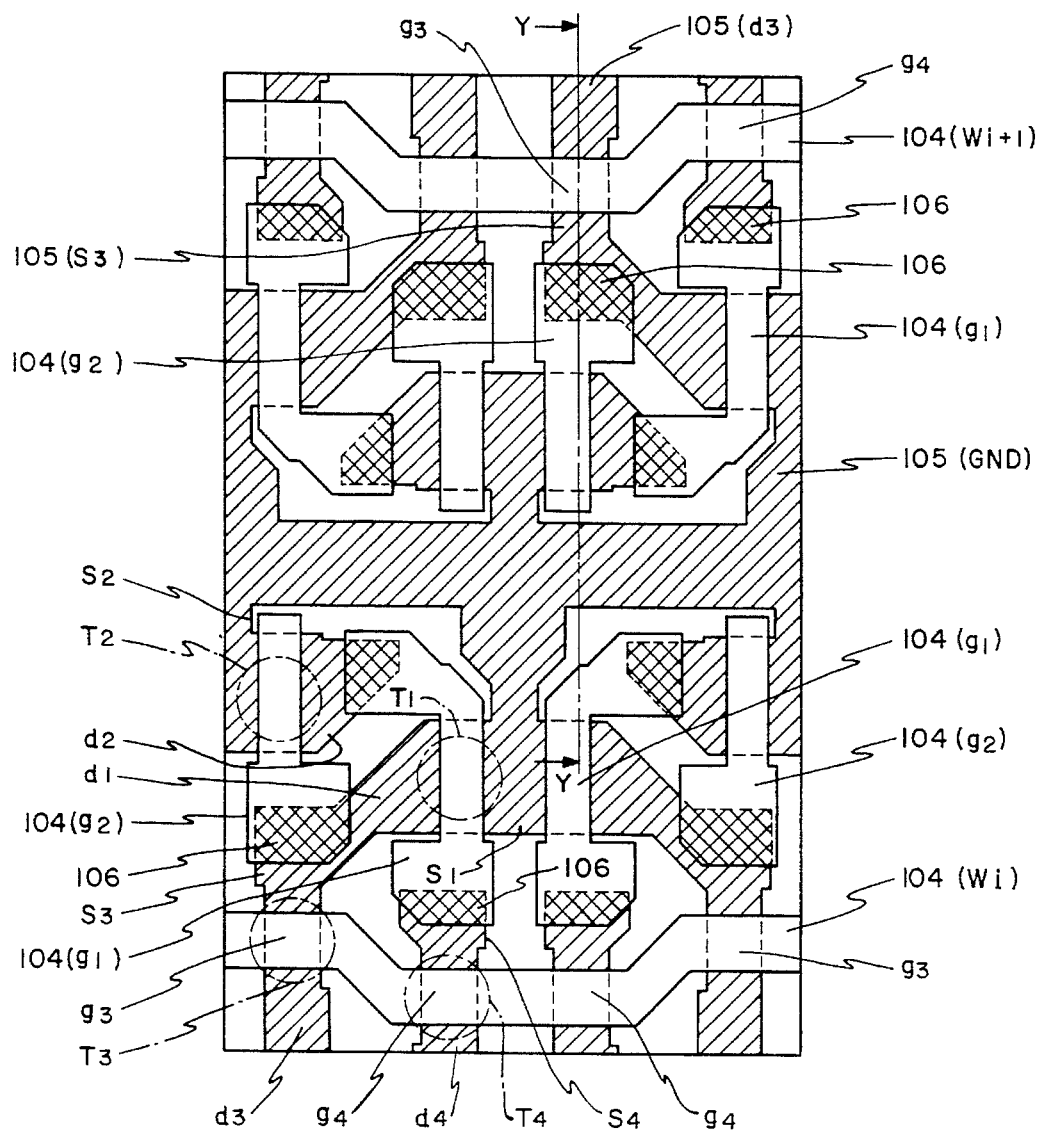
FIG. 4a is a plan view showing an arrangement of the memory cell array of the MOS SRAM according to the embodiment of the present invention.
Figure 4B:
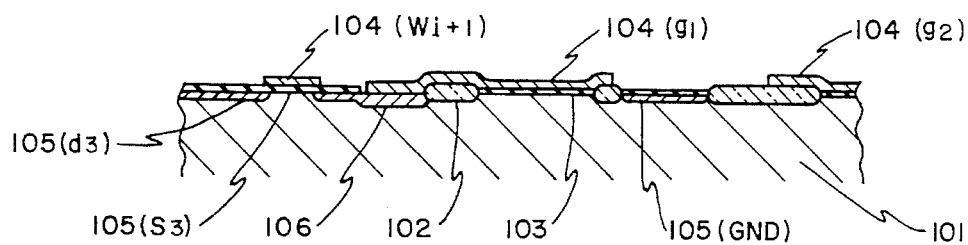

Then, as shown in FIGS. 4a and 4b, portions of the gate insulating film 103 on a region in which a direct contact 106 (cross-hatch portion in FIG. 4a) is to be formed and a region surrounding the element forming region are removed. Then, after formation of a first layer polysilicon film 104 having thickness of 400 nm and doped with phosphor at $1 \times 10^{21}$/ cm$^3$, the first layer polisilicon film 104 is etched to a predetermined pattern to form gate electrodes g1, g2, ... and word electrodes 104(wi), ..., which are connections of the gate electrodes g3 and g4 of the transfer transistors T3 and T4 in the direction of wordline. Then, ion injection is performed to the element forming region with using the first layer polysilicon film 104 and the field insulating film 102 as a mask and an N$^+$ type impurity diffusion layer 105. The N$^+$ type impurity diffusion layer 105 is shown in FIG. 4a by hatching for illustration purpose. Actually, peripheral portions of the layer 105 underlie the field insulating film 102 and the gate electrodes g1, g2, ... g3 and g4 as shown in FIG. 4b. A portion of the N$^+$ type impurity diffusion layer 105 in the direct contact 106 (cross-hatched portion in FIG. 4a) is thicker than other portions. Further, a portion 105(GND) of the N type impurity diffusion layer 105 traversing a central portion in FIG. 14a constitutes the grounding wiring GND.

In FIG. 4a, transistors of the memory cells Mi,s, Mi,s+1, Mi+1,s and Mi+1, s+1 are arranged in a lower left portion, a lower right portion, an upper left portion and an upper right portion, respectively. The arrangement of these transistors is symmetrical in X and Y directions. For example, the transistors T1 and T2 of the memory cell Mi,s are arranged in line symmetry with respect to the transistors T1 and T2 of the memory cell Mi,s+1.

Figure 5A:
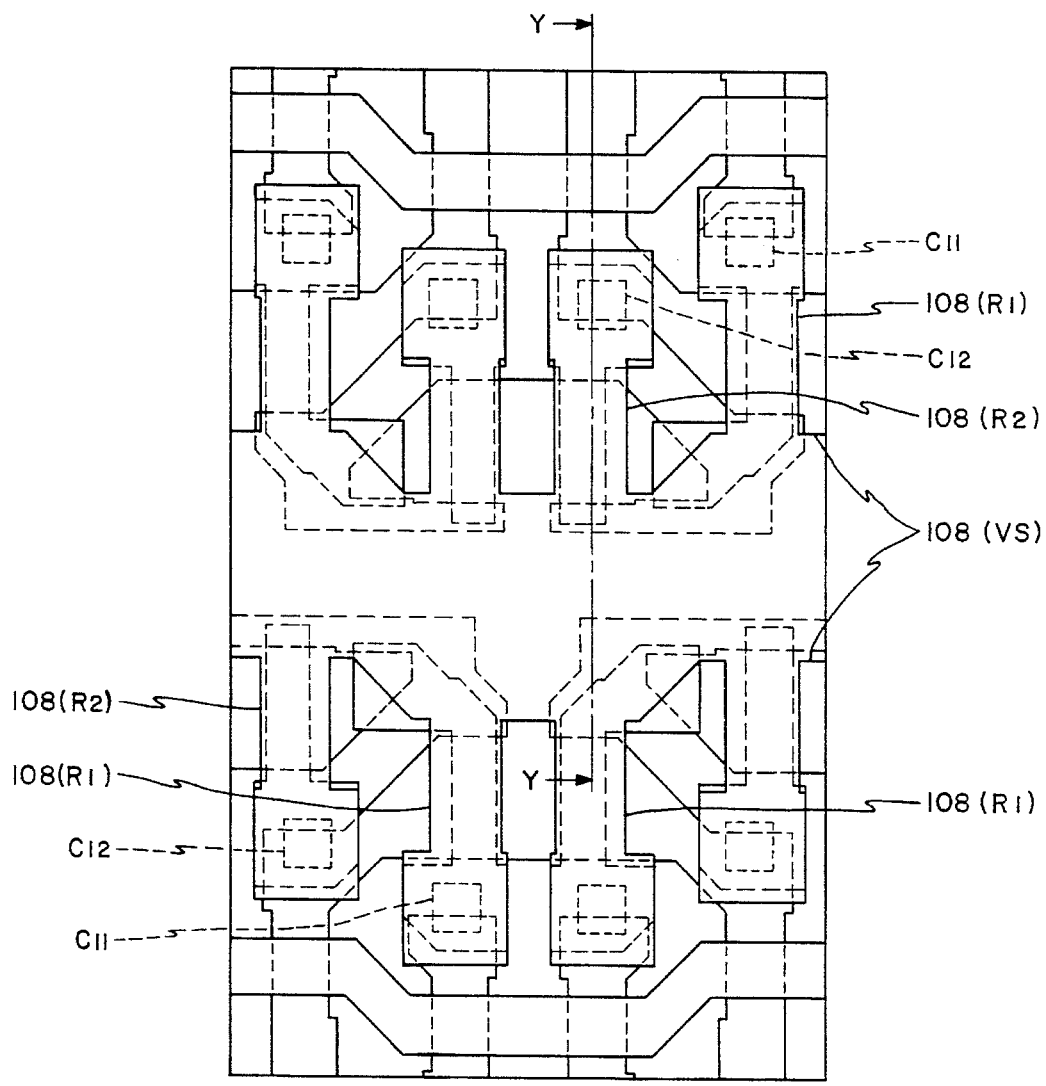
FIG. 5a is a plan view showing an arrangement of a polysilicon film has a load resistor of the memory cell array of the MOS SRAM according to the embodiment of the present invention.
Figure 5B:
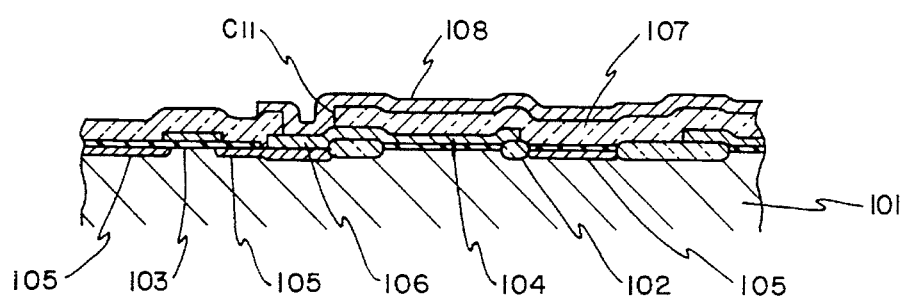

Then, as shown in FIGS. 5a and 5b, a PSG film about 500 nm thick is formed as a first interlayer insulating film 107. Contact holes C11 and C12 are formed on the direct contacts between the gate electrode g1 of the first drive transistor T1 and a source region S4 of the second transfer transistor T4 and between the gate electrode g2 of the second drive transistor T2 and a source region S3 of the first transfer transistor, respectively.

Then, as shown in FIGS. 5a and 5b, a second polysilicon film about 100 nm thick is deposited by low pressure CVD and phosphor is injected to the whole surface of this polisilicon film at $1 \times 10^{14}$ cm$^{-2}$. Thereafter, the second polisilicon film is patterned to form a resistive polisilicon film 108.

Figure 6A:
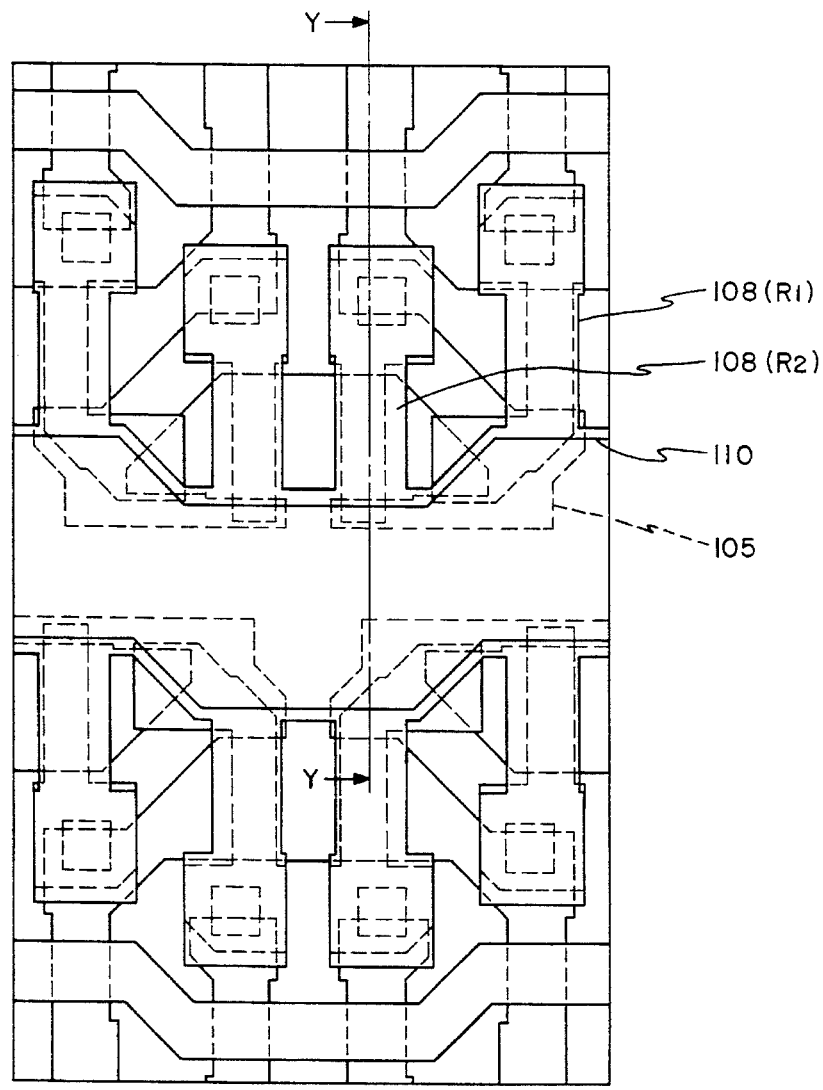
FIG. 6a is a plan view showing an arrangement of the load resistor of a portion of the memory cell array of the MOS SRAM according to the embodiment of the present invention.
Figure 6B:
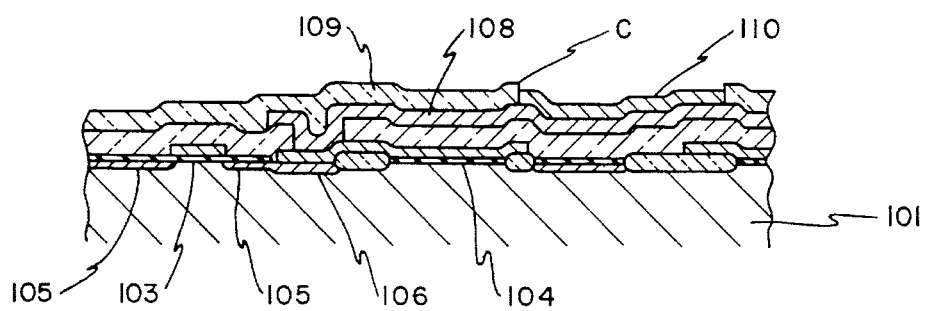

Then, as shown in FIGS. 6a and 6b, a silicon nitride film 100 nm thick is deposited by CVD as a second interlayer insulating film 109 and the holes C are formed on the main portion 108(VS) of the resistive polysilicon film. In each hole C of the main portion 108(VS) of the resistive polysilicon film, a tungsten film 110 about 70 nm thick is formed. That is, the tungsten film 110 is formed by selective growth thereof at 300° C. by utilizing reducing reaction of WF$_6$ so that it is self-aligned with respect to the hole C. Alternatively, a molybdenum film can be formed instead of the tungsten film by selectively growing molybdenum utilizing reducing reaction of MoF$_6$.

Further, instead of selective CVD, it is possible to eposite refractory metal film of tungsten, molybdenum or titanium on the whole surface and then etch out the film except portions covering the holes C, although CVD is advantageous in that such etching step is unnecessary.

Further, before the deposition of the second polysilicon film (108 in FIG. 5), it is possible to form tungsten film selectively on the first and second contact holes C11 and C12.

In the conventional method, a conductive polysilicon film is formed by injecting arsenic at $1 \times 10^{16}$ cm$^{-2}$ with using the second interlayer insulating film 109 as a mask. Although the region to which arsenic is to be implanted substantially aligns with the hole C, this technique has a defect that, during heat treatment for such as activation, arsenic is diffused even to the branch portions 108(R1) and 108(R2), reducing the effective length of the resistor portion.

Then, as shown in FIGS. 2a and 2b, a third interlayer insulating film 111 is deposited, contact holes C21 and C22 are provided on drain regions d3 and d4 of the transfer transistors T3 and T4 and then digit lines Ds, $\overline{Ds}$, . . . are formed by an aluminum film 112. At this time, an aluminum film (not shown) is the same layer as the digit lines Ds, $\overline{Ds}$ . . . is connected to the in-cell voltage source wiring 108(VS) every 256 memory cells, for instance. By connecting the aluminum film as the voltage source wiring to the tungsten film 110 through the contact holes (not shown) formed in the third interlayer insulating film, contact defect due to such as interdiffusion of aluminum and silicon can be prevented.

Although, in the described embodiment, the gate electrodes are provided by the first layer polysilicon film, it is possible to use a polycide film having a double layer structure composed of the first layer polysilicon film and a refractory metal film. Further, it is possible to form the digit lines Ds, $\overline{Ds}$ with the first light aluminum film and to form the voltage source wiring with a double layer aluminum wiring. Further, the metal wiring may be formed by not aluminum film but an alloy of aluminum and silicon or copper.

Although the present invention has been described with reference to a specific embodiment, this description is not meant to be construed in a limiting sense. Various modifications of the disclosed embodiment, as well as other embodiments of the present invention, will become apparent to persons skilled in the art upon reference to the description of the present invention. It is, therefore, contemplated that the appended claims will cover any modifications of embodiments as fall within the true scope of the present invention.

What is claimed is:

1. A method of fabricating a polysilicon film resistor element comprising the steps of:

forming a first insulating film on a semiconductor substrate, said first insulating film having a plurality of field isolation portions, each of said field isolation portions being partially embedded into said semiconductor substrate in order to divide a surface portion of said semiconductor substrate into first, second and third active regions, said second active region intervening between said first and third active regions;

forming first and second element regions into said first and second active regions, respectively;

selectively forming a resistive polysilicon film on said first insulating film, said resistive polysilicon film being doped with an impurity to provide a polysilicon film resistor element having a first end portion which is electrically connected to said first element region, a second end portion of said resistive polysilicon film being located over and isolated from said third active region by said first insulating film, an intermediate portion of said resistive polysilicon film which is between said first and second end portions being located over said second element region in said second active region, said intermediate portion being isolated from said second active region by said first insulating film, said second end portion of said resistive polysilicon film having a surface part;

forming a second insulating film to cover said resistive polysilicon film;

forming a contact hole to expose said surface part of said second end portion of said resistive polysilicon film; and forming a metal with a high melting point on said surface part of said second end portion of said resistive polysilicon film exposed by said contact hole.

2. The method as claimed in claim 1, wherein said first insulating film has a gate insulating film formed on a part of said second active region and said method further comprises the step of forming a gate polysilicon film on said gate insulating film, said gate polysilicon film forming a gate of a field effect transistor and being in an elongated position over said first active region to be in contact with said first element region, said second element region being formed by using said gate polysilicon film as a mask to form one of a source region and a drain region of said field effect transistor, and said first end portion of said resistive polysilicon film being in contact with said gate polysilicon film and electrically connected to said first element region.

\* \* \* \* \*